(12) United States Patent
Patterson et al.

(10) Patent No.: US 9,212,867 B2
(45) Date of Patent: Dec. 15, 2015

(54) HANDGUN AUTOMATIC SIGHTING SYSTEM

(71) Applicants: William Q. Patterson, Crozier, VA (US); Steven Woodward, N. Chesterfield, VA (US)

(72) Inventors: William Q. Patterson, Crozier, VA (US); Steven Woodward, N. Chesterfield, VA (US)

(*) Notice: Subject to any disclaimer, the term of this patent is extended or adjusted under 35 U.S.C. 154(b) by 0 days.

(21) Appl. No.: 14/613,399

(22) Filed: Feb. 4, 2015

(65) Prior Publication Data
US 2015/0226521 A1 Aug. 13, 2015

Related U.S. Application Data

(60) Provisional application No. 61/965,768, filed on Feb. 7, 2014.

(51) Int. Cl.
*F41G 1/34* (2006.01)
*H01H 11/00* (2006.01)
*H05K 3/30* (2006.01)
*F41C 33/02* (2006.01)
*F41G 1/01* (2006.01)

(52) U.S. Cl.
CPC .............. *F41G 1/345* (2013.01); *F41C 33/029* (2013.01); *F41C 33/0254* (2013.01); *F41G 1/01* (2013.01); *H01H 11/005* (2013.01); *H05K 3/30* (2013.01); *Y10T 29/49105* (2015.01)

(58) Field of Classification Search
CPC .... F41C 33/02; F41C 33/0254; F41C 33/029; F41G 1/32; F41G 1/34; F41G 1/345; F41G 1/02
USPC .......................................................... 42/132
See application file for complete search history.

(56) References Cited

U.S. PATENT DOCUMENTS

| | | | | |
|---|---|---|---|---|
| 3,914,873 A * | 10/1975 | Elliott, Jr. | ............... | F41G 1/345 42/117 |
| 4,003,507 A * | 1/1977 | Elton | ................... | F41C 33/0227 224/246 |
| 4,434,560 A * | 3/1984 | Comeyne | ................ | F41G 1/345 42/114 |
| 4,713,889 A * | 12/1987 | Santiago | .............. | F41C 33/0227 224/246 |
| 4,945,667 A * | 8/1990 | Rogalski | ................... | F41G 1/34 42/114 |
| 5,479,149 A * | 12/1995 | Pike | ..................... | F41C 33/0209 340/539.1 |
| 5,735,070 A * | 4/1998 | Vasquez | .................. | F41G 1/345 42/1.02 |
| 6,112,962 A | 9/2000 | Matthews | | |
| 6,233,836 B1 | 5/2001 | Uhlmann et al. | | |
| 6,336,285 B1 * | 1/2002 | Baumer | .................. | F41G 1/345 42/113 |
| 6,354,033 B1 * | 3/2002 | Findley | .................... | F41A 19/58 42/70.01 |
| 6,446,377 B1 | 9/2002 | Hollenbach et al. | | |
| 6,571,482 B1 | 6/2003 | Tymianski | | |
| 7,145,703 B2 * | 12/2006 | Sieczka | ..................... | F41G 1/30 356/247 |
| 2002/0166278 A1* | 11/2002 | Carlson | ................... | F41G 1/345 42/132 |
| 2006/0026886 A1* | 2/2006 | Doukas | ............... | F41C 33/0254 42/117 |

(Continued)

*Primary Examiner* — Bret Hayes
*Assistant Examiner* — Derrick Morgan

(57) ABSTRACT

A handgun sighting system that adjusts the intensity of a lighted front sight based on the ambient light conditions. A sighting rib on the handgun includes an electronic circuit having a power supply, a light emitting diode (LED), a photocell, and a reed switch. A holster for use with the sighting system includes a magnet therein. Return of the handgun to the holster brings the reed switch of the weapon in close proximity to the magnet and deactivates the LED and the electronic circuit. Withdrawal of the handgun from the holster activates the LED and the electronic circuit. The handgun sighting system automatically adjusts the intensity of the LED in accordance with changes in the ambient light conditions, as measured by the photocell, to provide an optimal sighting presentation for the shooter.

16 Claims, 14 Drawing Sheets

(56) References Cited

U.S. PATENT DOCUMENTS

| | | | |
|---|---|---|---|
| 2007/0062744 A1* | 3/2007 | Weidenheimer | F41B 6/00 307/71 |
| 2008/0061991 A1* | 3/2008 | Urban | F41C 33/0209 340/573.1 |
| 2012/0013258 A1* | 1/2012 | Browe | F41G 1/345 315/158 |
| 2012/0180370 A1* | 7/2012 | McKinley | F41G 1/02 42/146 |
| 2012/0198750 A1* | 8/2012 | Mansfield | F41G 1/345 42/132 |
| 2013/0104438 A1* | 5/2013 | Hines | F41C 27/00 42/84 |
| 2013/0185981 A1* | 7/2013 | Brabandt | F41G 1/35 42/117 |
| 2013/0283660 A1* | 10/2013 | Matthews | F41G 1/30 42/113 |
| 2013/0301243 A1* | 11/2013 | Rorick | F41C 33/0254 362/110 |
| 2014/0109457 A1* | 4/2014 | Speroni | F41G 11/003 42/114 |
| 2014/0150325 A1* | 6/2014 | Keng | F41G 11/003 42/118 |
| 2014/0162584 A1* | 6/2014 | Cope | F41C 33/0227 455/404.1 |
| 2014/0355258 A1* | 12/2014 | Izumi | F41G 1/34 362/114 |
| 2015/0176937 A1* | 6/2015 | Sullivan | F41A 17/063 42/84 |

* cited by examiner

HANDGUN AUTOMATIC SIGHTING SYSTEM

This application claims the priority of U.S. Provisional Application Ser. No. 61/965,768 filed Feb. 7, 2014.

FIELD OF INVENTION

This invention relates to handheld weapon aiming devices, and specifically to an automatic electronic sighting system for use with a conventional handgun to provide quick and accurate weapon sighting in both day and night conditions.

BACKGROUND OF THE INVENTION

Handheld weapons such as handguns typically include conventional sights including a front sight and a U-shaped rear sight, with the front sight being centered in the U-shaped rear sight during aiming of the weapon at a target. Although the conventional sights are adequate for aiming the weapon during conditions of high ambient light, such as on sunny days, they typically are inadequate for aiming during low light conditions, such as dusk or dawn, or at night.

Although there have been numerous attempts to improve the sighting of weapons in low lighting conditions, such as the use of radioluminous light sources on portions of the sights, the light sources emit at a constant intensity, which can lead to either an inadequate amount of light in high ambient light conditions or to an overpowering amount of light in low ambient light conditions.

Accordingly, it would be advantageous to provide a sighting system for a handheld weapon that would automatically adjust the sights to compensate for the ambient light conditions, thereby providing the proper amount of light to the sights regardless of the time of day or the prevailing lighting conditions. Furthermore, it would be advantageous to provide a sighting system that would activate instantaneously upon withdrawal from a holster, scabbard, or similar weapon storage device, and instantaneously deactivate when returned to the storage device. Such a device, when operated by battery power, would conserve power as the sighting device would be deactivated or powered down until removed from the storage device.

SUMMARY OF INVENTION

The present invention is a handheld weapon sighting system that includes a lighted front sight that automatically and continually adjusts in intensity for the ambient light to provide the optimum sighting device for the prevailing light conditions. The handheld weapon sighting system includes a sighting rib for securement to a weapon and a weapon holder or storage device for automatically activating the sighting system upon its withdrawal from the holder. The sighting rib includes a sight rib housing including a power supply, a light emitting diode (LED), a photocell, and an electronic circuit including a reed switch. The weapon holder and sight rib housing are constructed of non-magnetic materials and the weapon holder includes a magnet therein. Return of the weapon to the holster brings the reed switch of the weapon in close proximity to the magnet and switches the reed switch to a "held open" position, thereby deactivating the LED and the electronic circuit. Withdrawal of the weapon from the holster switches the reed switch to its normally closed state, thereby activating the LED and the electronic circuit. The light gathering surface of the photocell, located at the surface of the sight rib housing, automatically adjusts the intensity of the LED in order to provide optimal sighting presentation for the shooter. When the ambient light increases, the LED light output intensity increases and when the ambient light decreases, the LED light output intensity decreases. The weapon sighting system provides means for fast deployment of a weapon from a weapon holder that automatically activates an illuminated front sight, allowing the user faster acquisition and alignment of the sights of the weapon on the intended target in both day and night conditions.

OBJECTS AND ADVANTAGES

A first object of the invention is to provide a sighting system for a handheld weapon that will enable quick and accurate weapon sighting in both day and night conditions.

A second object is to provide a holster that enables secure carry and fast deployment of a handgun.

A further object of the invention is to provide a means for instant activation of an electronic sighting apparatus upon deployment of the handgun from a holster, allowing faster acquisition and alignment of the illuminated front sight on the intended target.

A further object is to provide a means for automatic deactivation of the electronic sighting apparatus upon the re-holstering of the handgun.

Another object of the invention is to provide a lighted front sight for a weapon whose light intensity is automatically and instantaneously adjusted to provide the optimum light sight view in the ambient light conditions prevailing at the time of the aiming and firing of the weapon.

Another object is to provide a system for automatically adjusting a lighted sight to in correlation to the ambient light conditions.

Another object of the invention is to provide a weapon sighting system that can be easily mounted to the top of the gun slide on a conventional handgun.

These and other objects and advantages of the present invention will be better understood by reading the following description along with reference to the drawings. Although the sighting system of the present invention is applicable to any handheld weapon and its respective weapon holder, the description that follows will describe the invention with respect to a handgun and a holster.

BRIEF DESCRIPTION OF THE SEVERAL VIEWS OF THE DRAWING(S)

Figure 1:
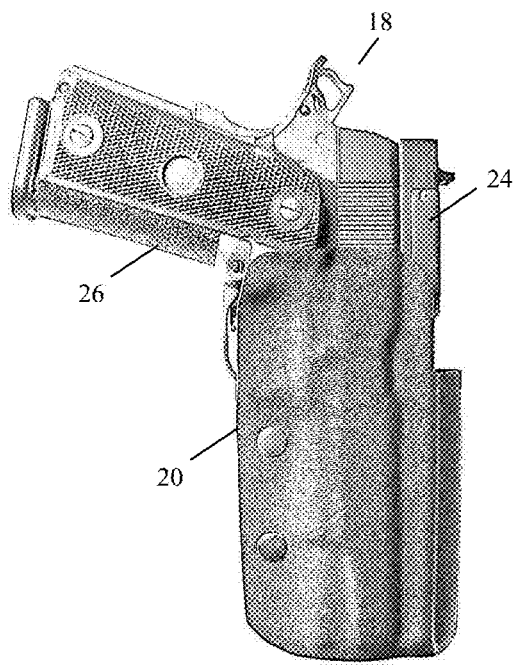
FIG. 1 is a front perspective view of a handgun automatic electronic sighting system according to the present invention.

| TABLE OF NOMENCLATURE | |
|---|---|
| Part No. | Description |
| 18 | handgun automatic electronic sighting system |
| 20 | automatic activation holster |
| 20a | formed Kydex holster |
| 21 | activation magnet |
| 21a | magnet compartment |
| 22 | belt mount |
| 24 | electronic sighting apparatus |
| 25 | electronic sighting apparatus mounted |
| 25a | electronic sighting apparatus features |
| 26 | conventional 45 caliber handgun |
| 28 | top of the gun slide |
| 30 | sight rib housing unit |
| 31 | illuminating front sight |
| 33 | interchangeable rear sight |
| 33a | enlarged back elevation view (rear sights) |
| 33b | low rear sight |
| 33c | high rear sight |
| 35 | LED (light emitting diode) |
| 35a | luminous red dot |
| 36 | 12 v battery power source |
| 37 | power switch |
| 38 | driving circuit |
| 39 | photocell |
| 40 | sight rib housing unit components |
| 40a | electronic operation circuit |
| 41 | front sight section |
| 41a | side cross sectional view |
| 41b | bottom view |
| 42 | rear sight section |
| 42a | side cross sectional view |
| 42b | top cross sectional view |
| 43 | power source section |
| 43a | side cross sectional view |
| 43b | enlarged side cross sectional view |
| 43c | bottom cross sectional view |
| 44 | driving circuit section |
| 44a | bottom view |
| 44b | top cross sectional view |
| 45 | means of mounting |
| 45a | right side cutaway view |
| 45b | top view |
| 46 | front sight unit |
| 46a | enlarged right side cross sectional view |
| 46b | enlarged front elevation view |
| 46c | enlarged top cross sectional view |
| 47 | front sight |
| 47a | LED compartment |
| 47b | front of LED compartment |
| 47c | back of LED compartment |
| 47d | LED light aperture |
| 47e | front sight face |
| 48 | front sight base |
| 48a | front sight base rim |
| 48b | LED vertical wire groove |
| 48c | LED horizontal wire groove |
| 49 | LED light installed |
| 49a | enlarged right side cross sectional view |
| 49b | enlarged top cross sectional view |
| 50 | LED flange |
| 50a | LED positive lead wire |
| 50b | LED negative lead wire |
| 51 | front sight compartment |
| 51a | right side (front sight compartment) |
| 51b | bottom (front sight compartment) |
| 52 | front sight compartment rim |
| 53 | front sight cutout |
| 54 | front sight unit installed |
| 54a | enlarged right side cross sectional view |
| 54b | enlarged bottom view |
| 56 | LED positive wire channel |
| 58 | LED negative wire channel |
| 60 | rear sight dovetail |
| 60a | right side (rear sight dovetail) |

-continued

TABLE OF NOMENCLATURE

| Part No. | Description |
|---|---|
| 60b | top (rear sight dovetail) |
| 61 | rear sight set screw hole |
| 61a | rear sight set screw |
| 61b | center notch |
| 62 | rear sight installed |
| 62a | enlarged right side cross sectional view |
| 62b | enlarged rear elevation view |
| 62c | alignment of the front and rear sights |
| 62d | target |
| 62e | sight picture |
| 63 | back end (sight rib housing unit) |
| 64 | power switch compartment |
| 64a | right side (power switch compartment) |
| 64b | enlarged front view (power switch compartment) |
| 64c | bottom (power switch compartment) |
| 66 | power switch wire hole |
| 68 | battery compartment |
| 68a | front side (battery compartment) |
| 68b | bottom (battery compartment) |
| 68c | outside ends (battery compartment) |
| 68d | inside back (battery compartment) |
| 69 | battery compartment frame |
| 69a | cover screw anchor hole |
| 69b | thumbnail slot |
| 69c | access point |
| 70 | clip holder screw anchor hole |
| 71 | power switch wire groove |
| 72 | wire channel access hole |
| 72a | wire channel |
| 73 | power switch installed |
| 73a | enlarged side cross sectional view |
| 73b | enlarged front view (power switch installed) |
| 73c | enlarged bottom cross sectional view |
| 74 | power switch toggle |
| 74a | toggle position OFF |
| 74b | toggle position ON |
| 75 | power switch leg wire |
| 75a | power switch supply wire |
| 76 | battery installed |
| 76a | enlarged front view (battery installed) |
| 76b | enlarged bottom cross sectional view |
| 77 | battery clip holder (positive) |
| 78 | battery clip holder (negative) |
| 79 | clip holder screw |
| 79a | clip holder screw hole |
| 80 | battery positive lead wire |
| 81 | battery negative lead wire |
| 82 | battery cover |
| 82a | front view of battery cover fastened |
| 82b | enlarged front view (battery cover) |
| 82c | enlarged side cross sectional view (battery cover) |
| 82d | front exploded view (battery cover) |
| 82e | top cross sectional view (battery cover) |
| 83 | front (battery cover) |
| 83a | beveled edge |
| 83b | battery cover support |
| 84 | right side (battery cover) |
| 85 | battery cover screw |
| 86 | cover screw hole |
| 86a | counter sink bore |
| 88 | ECU compartment |
| 88a | bottom (ECU compartment) |
| 88b | top (ECU compartment) |
| 90 | photocell compartment |
| 90a | bottom (photocell compartment) |
| 90b | top (photocell compartment) |
| 91 | photocell compartment rim |
| 92 | ECU (electronic control unit) |
| 92a | enlarged bottom view (ECU) |
| 92b | enlarged top view (ECU) |
| 92c | bottom (ECU) |
| 92d | top (ECU) |
| 93 | ECU electronic components |
| 94 | printed circuit board |
| 95 | battery positive solder pad |
| 96 | current limiting resistor R1 |
| 98 | parallel bypass resistor R2 |
| 99 | reed switch RS |
| 102 | LED positive solder pad |
| 104 | ECU installed |
| 104a | enlarged bottom view (ECU installed) |
| 104b | enlarged top cross sectional view |
| 106 | photocell installed |
| 106a | enlarged bottom view (photocell installed) |
| 106b | enlarged top view (photocell installed) |
| 106c | bottom (photocell) |
| 106d | top (photocell) |
| 107 | photocell ½ shutter |
| 107a | photocell ¼ shutter |
| 108 | photocell top lead wire |
| 108a | photocell bottom lead wire |
| 110 | bolt hole |
| 112 | counter bore |
| 114 | ⅜" anchor bolt |
| 116 | ⅜" drill hole |
| 118 | primary electronic components |
| 119 | block diagram illustration |
| 119a | electronic circuit schematic |
| 120 | power supply (block) |
| 120a | power supply circuit schematic |
| 120b | 12 v cell |
| 120c | cell positive side |
| 120d | cell negative side |
| 122 | power switch (block) |
| 122a | power switch circuit schematic |
| 122b | SPST power switch SW |
| 122c | ON-OFF pole |
| 122d | power pole |
| 124 | ECU (block) |
| 124a | ECU circuit schematic |
| 124b | solder pad BATTERY+ |
| 124c | current limiting resistor R1 |
| 124d | parallel bypass resistor R2 |
| 124e | reed switch RS |
| 124f | solder pad LED+ |
| 126 | photocell (block) |
| 126a | photocell circuit schematic |
| 126b | photocell sensor PS |
| 126c | top connection |
| 126d | bottom connection |
| 128 | LED light (block) |
| 128a | LED light circuit schematic |
| 128b | light emitting diode |
| 128c | anode+ |
| 128d | cathode− |

DETAILED DESCRIPTION

Figure 1A:
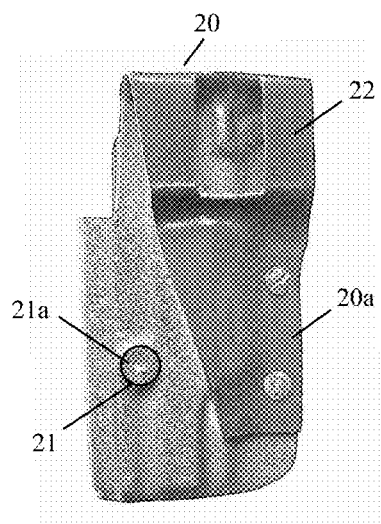
FIG. 1A is a rear perspective view of the automatic activation holster portion of the handgun sighting system shown in FIG. 1.

In accordance with the present invention, FIG. 1 depicts a handgun automatic electronic sighting system 18 including an automatic activation holster 20 and an electronic sighting apparatus 24 that is mounted on a conventional handgun 26. As shown in FIG. 1A, the automatic activation holster 20 includes a formed Kydex® holster 20a having an activation magnet 21 installed in a magnet compartment 21a and a belt mount 22 for attaching the holster to the belt of a user. Kydex® is an acrylic-polyvinyl chloride thermoplastic material available from Kydex LLC of Bloomsburg, Pa. The activation magnet 21 is preferably a neodymium magnet, available from Dura Magnetics, Inc., of Sylvania, Ohio.

Figure 2:
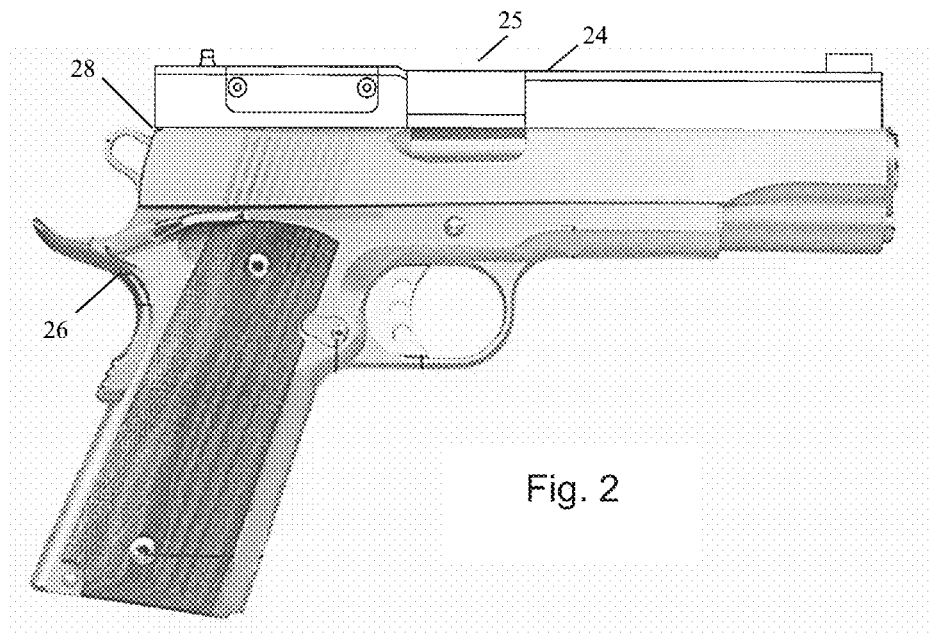
FIG. 2 is a right side elevation view of a sight rib housing according to the invention mounted to the gun slide of a conventional handgun.

Referring to FIG. 2 for the remaining primary components, there is shown a right side elevation view of the electronic sighting apparatus 24 mounted 25 on a conventional handgun 26 by attachment to the top of the gun slide 28. The electronic sighting apparatus 24 comprises a sight rib housing unit 30

(see FIG. 2A) constructed from a solid piece of Delrin® 150 acetal homopolymer, available from E. I. DuPont de Nemours and Company, Wilimington, Del., that has been machined to provide compartments for an electronic operation circuit. Delrin® is a plastic that offers an excellent balance of properties that include high tensile strength, extreme durability, superior impact resistance, and excellent machinability.

Figure 2A:
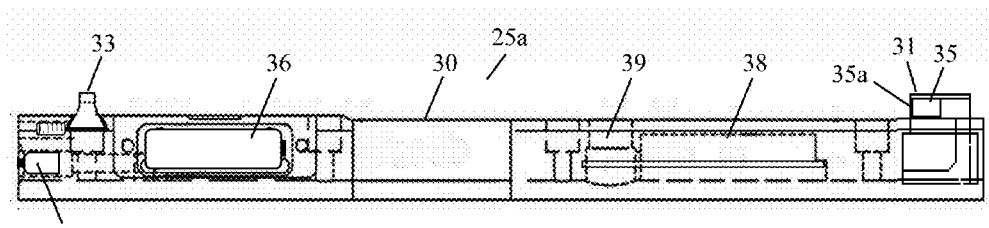
FIG. 2A is a right side cross sectional view illustrating the features of the electronic sighting apparatus.
Figure 3:
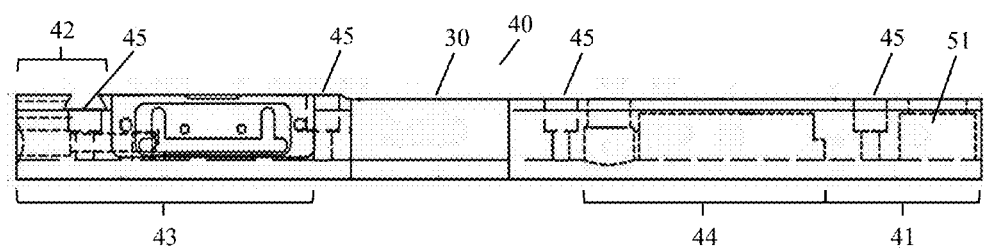
FIG. 3 is a right side cross sectional view showing the primary components of a sight rib housing unit.

Referring now to FIG. 2A, the electronic sighting apparatus 24 includes a sight rib housing unit 30 with an illuminating front sight 31 and an interchangeable rear sight 33. The illuminating front sight 31 includes a light emitting diode (LED) 35, most preferably a red LED, as the light source in the form of a luminous red dot 35a, along with a battery power source 36, a power switch 37 and a driving circuit 38 to operate the LED 35. The battery source 36 is preferably a 12-volt power source. The electronic sighting apparatus 24 includes a photocell 39 that provides a means for monitoring the ambient light conditions and automatically adjusting the intensity of light output from the LED 35 in correlation to the amount of ambient light available. When the photocell measures an increase in the ambient light, the electronic sighting apparatus 24 increases the LED 35 light output intensity. When the photocell measures a decrease in the ambient light, the electronic sighting apparatus 24 decreases the LED 35 light output intensity. When the photocell detects no ambient light, such as with the handgun in total darkness, the electronic sighting apparatus 24 produces a minimal amount of light output from the LED 35. There is no complete back out of the LED in total darkness.

FIG. depicts the sight rib housing unit components 40 comprising a front sight section 41, a rear sight section 42, a power source section 43, a driving circuit section 44 and a means of mounting 45. The front sight section 41 includes a front sight compartment 51 designed to house a front sight unit 46.

Figure 4:
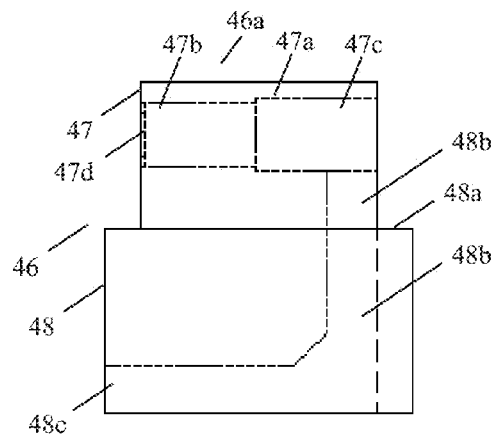
FIG. 4 is an enlarged right side cross sectional view of a front sight unit showing a LED compartment.

With reference to FIG. 4 the front sight 47 includes a LED compartment 47a having two sections designated as front of the LED compartment 47b and back of the LED compartment 47c respectively. The front of the LED compartment 47b secures the LED 35 flush against an aperture 47d, while the back of the LED compartment 47c is holds the LED 35 securely in place within the LED compartment 47a. The front sight unit 46 also comprises a front sight base 48 with a front sight base rim 48a and two wire grooves, identified as the LED vertical wire groove 48b or the LED horizontal wire groove 48c, that are designed to house electronic components within the front sight unit 46.

Figure 4A:
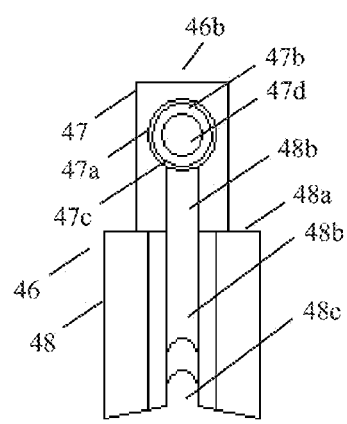
FIG. 4A is an enlarged front elevation view of the front sight unit shown in FIG. 4.
Figure 4B:
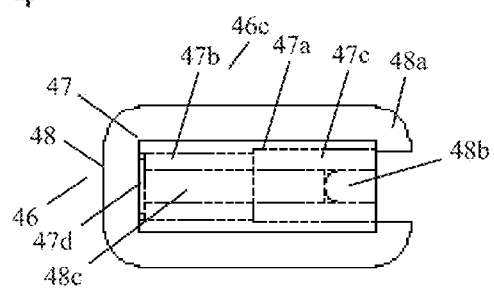
FIG. 4B is an enlarged top cross sectional view of the front sight unit shown in FIG. 4.

Referring now to FIG. 4A, there is shown an enlarged front elevation view 46b of the front sight unit 46 showing the same component reference numbers illustrated in FIG. 4, as they apply to a front elevation view 46b. FIG. 4A also shows that the LED compartment 47a is cylindrical in shape by design in order to house a cylindrical shaped LED 35—FIG. 5. FIG. 4B is an enlarged top cross sectional view 46c of the front sight unit 46 showing the same component reference numbers illustrated in FIG. 4, as they apply to a top cross sectional view 46c. A more detailed description of the front sight unit 46 will follow below.

Figure 5:
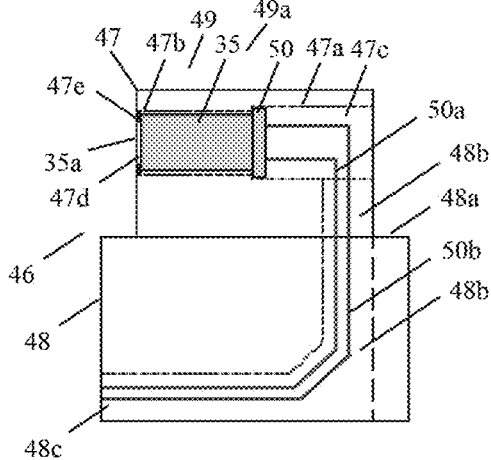
FIG. 5 is an enlarged right side cross sectional view a LED light installed in the front sight unit.
Figure 5A:
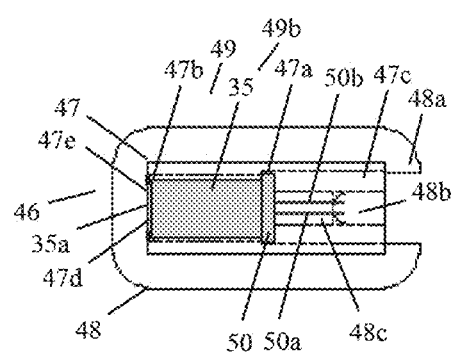
FIG. 5A is an enlarged top cross sectional view of the LED light installed in the front sight unit.

FIG. 5 is an enlarged right side cross sectional view 49a of the LED light installed 49 in the LED compartment 47a within the front sight unit 46. The illustration shows the LED 35 housed in the front of the LED compartment 47b flush against the aperture 47d, which allows light produced by the LED 35 from inside of the LED compartment 47a to be seen in the form of a luminous red dot 35a on the front sight face 47e of the front sight 47. The back of the LED compartment 47c holds the LED flange 50 with two attached lead wires, identified as a LED positive lead wire 50a and a LED negative lead wire 50b, securely in place within the LED compartment 47a. The LED positive lead wire 50a and LED negative lead wire 50b extend downward out from the back of the LED compartment 47c into the vertical wire groove 48b, continuing to travel downward past the front sight base rim 48a, thru the front sight base 48 to the vertical wire groove 48b, then into the horizontal wire groove 48c until ending flush with the front sight base 48. FIG. 5A is an enlarged top cross sectional view 49b of the LED light installed 49 in the LED compartment 47a within the front sight unit 46 showing the same component reference numbers illustrated in FIG. 5, as they apply to a top cross sectional view 49b.

Figure 6:
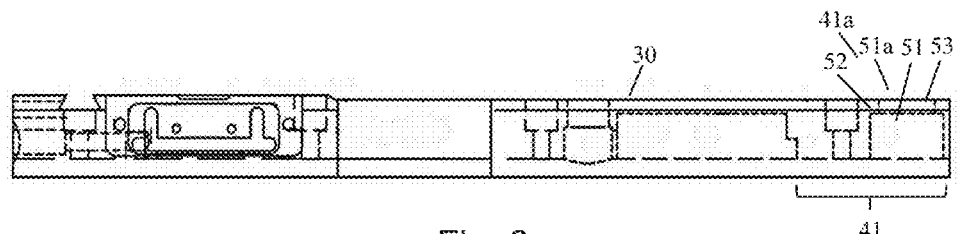
FIG. 6 is a right side cross sectional view of the front sight section showing a front sight compartment.

FIG. 6 is a side cross sectional view 41a of the front sight section 41 on the sight rib housing unit 30 showing the right side 51a of the front sight compartment 51 comprising a front sight compartment rim 52 and a front sight cutout 53. The front sight compartment 51 is designed to house the front sight unit 46 within the sight rib housing unit 30, while the front sight compartment rim 52 and the front sight cutout 53 are designed to hold the front sight base 48 and the front sight 47 of the front sight unit 46 securely in place within the front sight compartment 51.

Figure 6A:
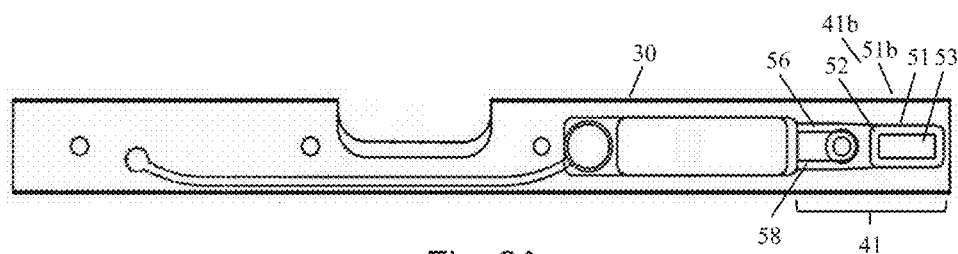
FIG. 6A is a bottom view of the embodiment shown in FIG. 6.

FIG. 6A is a bottom view 41b of the front sight section 41 on the sight rib housing unit 30 showing the bottom 51b of the front sight compartment 51 with same component reference numbers shown in FIG. 6, as they apply to a bottom view 41b. Also shown in the front sight section 41 is a LED positive wire channel 56 and a LED negative wire channel 58 designed to connect and hold electronic components securely in place within the sight rib housing unit 30.

Figure 7:
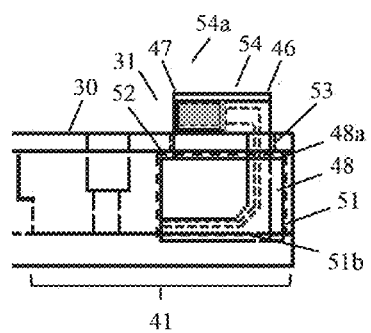
FIG. 7 is an enlarged right side cross sectional view of the front sight unit installed.

Referring now to FIG. 7, there is shown an enlarged right side cross sectional view 54a of the front sight unit installed 54 within the front sight compartment 51 of FIG. 6. The front sight unit 46 is received into the bottom 51b of the front sight compartment 51 by inserting the front sight 47 to and thru the front sight cutout 53 until the front sight base rim 48a stops flush against the front sight compartment rim 52. The front sight cutout 53 and the front sight compartment rim 52 hold the front sight 47 and the front sight base 48 of the front sight unit 46 securely in place within the sight rib housing unit 30.

Figure 7A:
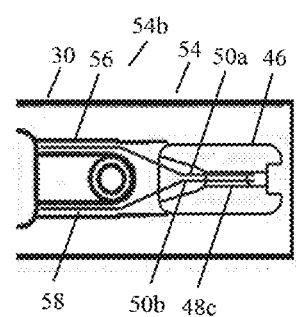
FIG. 7A is an enlarged bottom view of the front sight unit installed.

FIG. 7A is an enlarged bottom view 54b of the front sight unit installed 54 within the front sight compartment 51 of FIG. 6A showing the LED positive lead wire 50a and the LED negative lead wire 50b coming out of the LED horizontal wire groove 48c separating into two different directions. The LED positive lead wire 50a travels thru the LED positive wire channel 56 and the LED negative lead wire 50b travels thru the LED negative wire channel 58 where they are both held securely in place within the sight rib housing unit 30.

Figure 8:
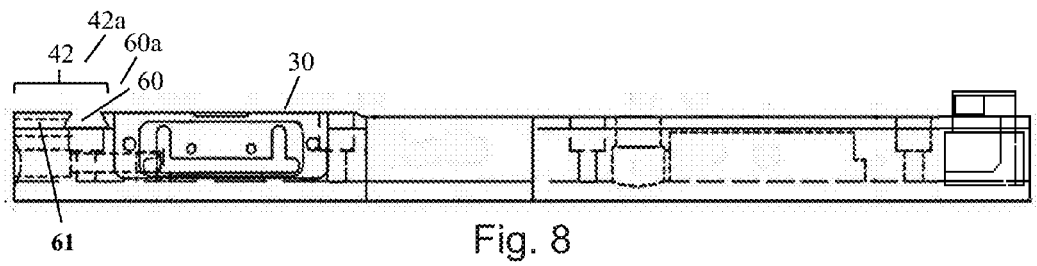
FIG. 8 is a right side cross sectional view of the rear sight section.
Figure 8A:
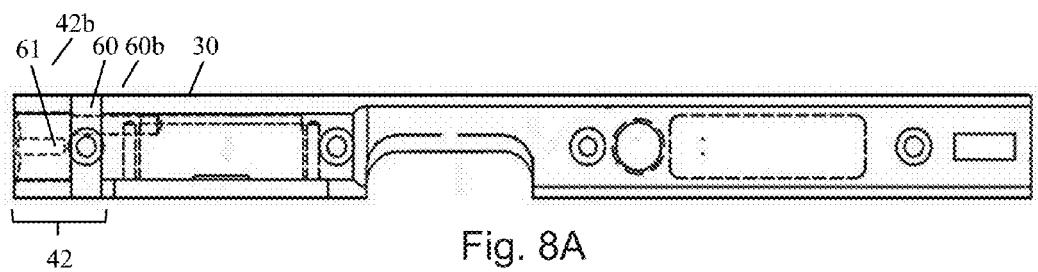
FIG. 8A is a top cross sectional view of the embodiment shown in FIG. 8.

FIG. 8 is a side cross sectional view 42a of the rear sight section 42 on the sight rib housing unit 30 showing the right side 60a of a rear sight dovetail 60 and a rear sight set screw hole 61. The rear sight dovetail 60 is designed as a means for attaching a interchangeable rear sight 33 to the sight rib housing unit 30. The rear sight set screw hole 61 is designed to receive a rear sight set screw 61a that is used to hold an interchangeable rear sight 33 securely in place within the rear sight dovetail 60 on the sight rib housing unit 30. FIG. 8A is a top cross sectional view 42b of the rear sight section 42 on the sight rib housing unit 30 showing the top 60b of the rear sight dovetail 60 and the rear sight set screw hole 61. A more detailed description of the rear sight section 42 will follow below.

Figure 9:
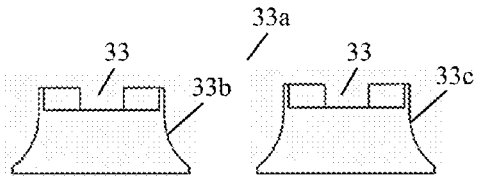
FIG. 9 is a back elevation view showing two different heights of the interchangeable rear sight.

FIG. 9 is an enlarged back elevation view 33a of the interchangeable rear sight 33 showing two different sizes identified as a low rear sight 33b and a high rear sight 33c that are used for the purpose of lowering or raising the impact point on a target from a fired round. The low rear sight 33b will lower the impact point and the high rear sight 33c will raise the impact point.

Figure 9A:
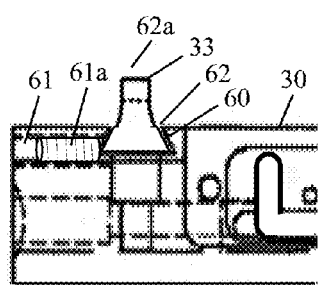
FIG. 9A is an enlarged right side cross sectional view of a rear sight installed.

FIG. 9A is an enlarged right side cross sectional view 62a of the rear sight installed 62 within the rear sight dovetail 60 of FIG. 8. The interchangeable rear sight 33 is inserted into the rear sight dovetail 60 until centered with the sight rib housing unit 30. The rear sight set screw hole 61 receives the rear sight set screw 61a that is tightened to hold the interchangeable rear sight 33 securely in place within the rear sight dovetail 60 on the sight rib housing unit 30.

Figure 9B:
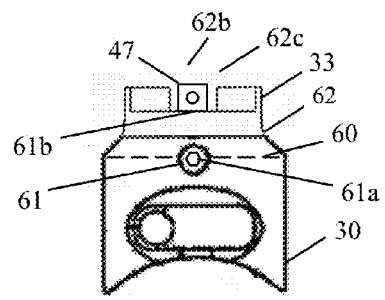
FIG. 9B is an enlarged rear elevation view of the sight rib housing unit with the rear sight installed.

FIG. 9B is an enlarged rear elevation view 62b of the rear sight installed 62 in the rear sight dovetail 60 and the alignment of the front and rear sights 62c. FIG. 9B shows the interchangeable rear sight 33 installed in the rear sight dovetail 60 centered on the sight rib housing unit 30, aligning the front sight 47 with the center notch 61b of the interchangeable rear sight 33. Once the interchangeable rear sight 33 has been properly aligned with the front sight 47, the rear sight set screw 61a inside of the rear sight set screw hole 61 is tightened to hold the interchangeable rear sight 33 securely in place within the rear sight dovetail 60 on the sight rib housing unit 30.

Figure 10:
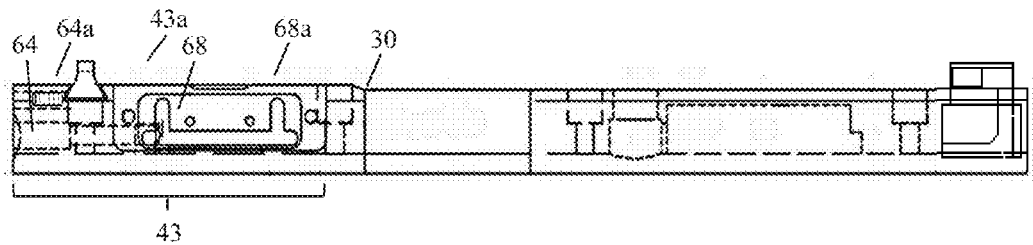
FIG. 10 is a right side cross sectional view of the power source section on the sight rib housing unit.

FIG. 10 is a side cross sectional view 43a of the power source section 43 on the sight rib housing unit 30 showing the right side 64a of a power switch compartment 64 and the front side 68a of a battery compartment 68. The power switch compartment 64 is designed to house the power switch 37—FIG. 2A and the battery compartment 68 is designed to house the 12v battery power source 36—FIG. 2A. A more detailed description of the power switch compartment 64 and battery compartment 68 will follow below.

Figure 10A:
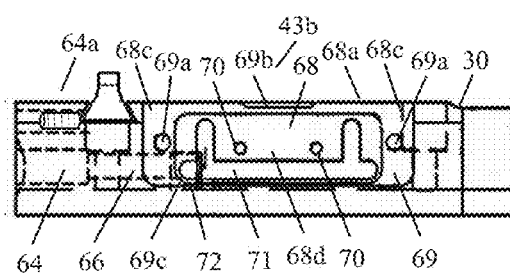
FIG. 10A is an enlarged view of the embodiment shown in FIG. 10.

FIG. 10A is an enlarged side cross sectional view 43b of the power source section 43 on the sight rib housing unit 30 showing a more detailed illustration of the power switch compartment 64 and the battery compartment 68 shown in FIG. 10. The power switch compartment 64 contains a power switch wire hole 66 beginning at the back of the power switch compartment 64 and terminating inside of the battery compartment 68 at the wire channel access hole 72. The power switch wire hole 66 is designed to provide a means of connecting electronic components between the power switch compartment 64 and the battery compartment 68.

FIG. 10A also shows the battery compartment 68 comprising a battery compartment frame 69 with two cover screw anchor holes 69a on the outside ends 68c of the battery compartment 68 and two clip holder screw anchor holes 70 on the inside back 68d of the battery compartment 68. Located below the clip holder screw anchor holes 70 is a power switch wire groove 71 that intersects with the power switch wire hole 66 forming an access point 69b to the wire channel access hole 72. The access point 69b is designed for connecting electronic components from the power switch compartment 64 and the battery compartment 68 to other electronic components located at the front sight unit 46.

Figure 11:
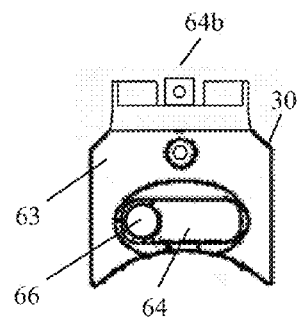
FIG. 11 is an enlarged front elevation view of the power switch compartment shown in FIG. 10A.

FIG. 11 is an enlarged front view 64b of the power switch compartment 64 recessed in the back end 63 of the sight rib housing unit 30 showing the beginning of the power switch wire hole 66 within the power switch compartment 64. The power switch wire hole 66 terminates inside of the battery compartment 68 at the access point 69b to the wire channel access hole 72.

Figure 12:
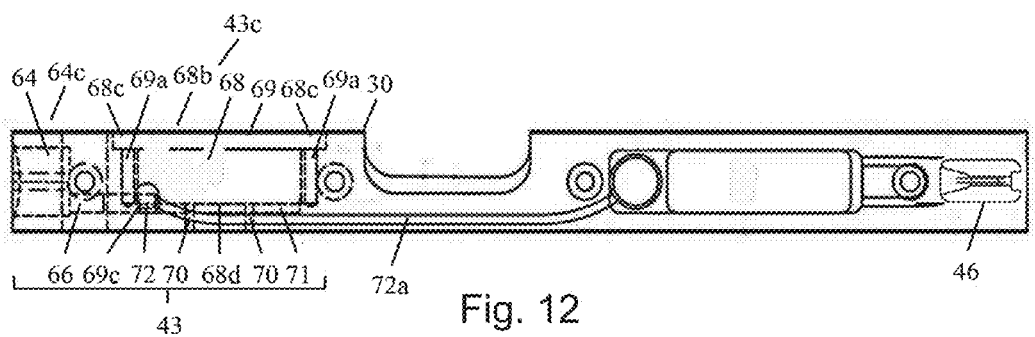
FIG. 12 is a bottom cross sectional view of the power switch and battery compartments.

FIG. 12 is a bottom cross sectional view 43c of the power source section 43 on the sight rib housing unit 30 showing the bottom 64c of the power switch compartment 64 and the bottom 68b of the battery compartment 68. The power switch compartment 64 contains a power switch wire hole 66 beginning at the back of the power switch compartment 64 and terminating inside of the battery compartment 68 at the wire channel access hole 72. FIG. 12 also shows the battery compartment 68 comprising a battery compartment frame 69 with two cover screw anchor holes 69a on the outside ends 68c of the battery compartment 68 and two clip holder screw anchor holes 70 on the inside back 68d of the battery compartment 68. Located below the clip holder screw anchor holes 70 is a power switch wire groove 71 that intersects with the power switch wire hole 66 forming an access point 69b to the wire channel access hole 72 that leads to the wire channel 72a. The wire channel 72a is designed for connecting electronic components from the power switch compartment 64 and the battery compartment 68 to other electronic components located at the front sight unit 46.

Figure 13:
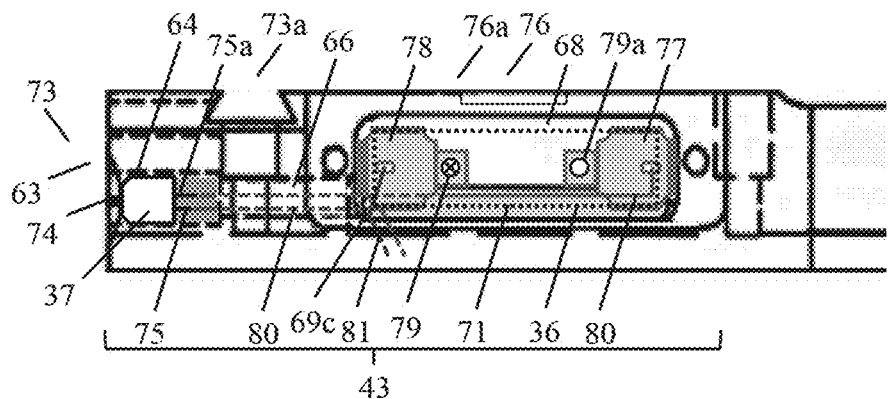
FIG. 13 is an enlarged right side cross sectional view of the power switch and battery installed.

FIG. 13 is an enlarged side cross sectional view 43b of the power source section 43 as illustrated in FIG. 10A, showing an enlarged side view 73a of the power switch installed 73 within power switch compartment 64 and an enlarged front view 76a of the battery installed 76 within battery compartment 68. The enlarged side view 73a of the power switch installed 73 shows the power switch 37 comprising a power switch toggle 74, a power switch leg wire 75 and a power switch supply wire 75a. Power switch toggle 74 enables a user to manually turn on or cut off power to the electronic circuit 40a via the power switch 37.

The power switch 37 is received into the power switch compartment 64 by inserting the power switch leg wire 75 and the power switch supply wire 75a into the power switch compartment 64, thru the power switch wire hole 66 until stopping inside of the battery compartment 68 at the access point 69c. The insertion of the power switch 37 into the power switch compartment 64 continues until the power switch toggle 74 is flush with the back end 63 of the sight rib housing unit 30.

The enlarged front view 76a of the battery installed 76 shows a battery clip holder (positive) 77 and a battery clip holder (negative) 78, each comprising a clip holder screw hole 79a that is aligned to a clip holder screw anchor hole 70 and secured to the inside back 68d of the battery compartment 68 with a clip holder screw 79.

The power switch leg wire 75 coming out of the power switch wire hole 66 continues to travel thru the power switch wire groove 71 and connects to the battery positive lead wire 80 that is attached to the battery clip holder (positive) 77, while the power switch supply wire 75a coming out of the power switch wire hole 66 becomes the continuation of the battery positive lead wire 80 and travels down thru the wire channel access hole 72 into the wire channel 72a. The battery negative lead wire 81 that is attached to the battery clip holder (negative) 78 also travels down thru the wire channel access hole 72 into the wire channel 72a.

Figure 13A:
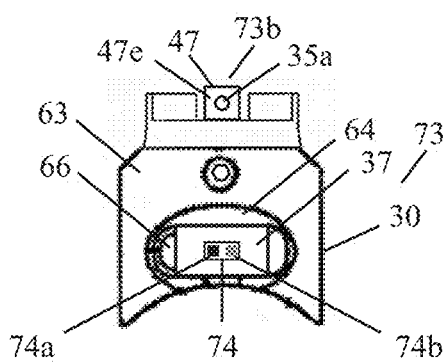
FIG. 13A is an enlarged front elevation view of the power switch installed.

FIG. 13A is an enlarged front view 73b of the power switch installed 73 in the power switch compartment 64 recessed in the back end 63 of the sight rib housing unit 30, showing the two different operation positions of the power switch toggle 74 on the power switch 37, identified as the toggle position OFF 74a or as the toggle position ON 74b. The toggle position OFF 74a deactivates the handgun automatic electronic sighting system 18 for when the gun is being stored or used for regular target shooting. The toggle position ON 74b activates the handgun automatic electronic sighting system 18 for using the automatic activation holster 20 and the electronic sighting apparatus 24 in conjunction for quick and accurate weapon sighting in both day and night conditions.

Figure 13B:
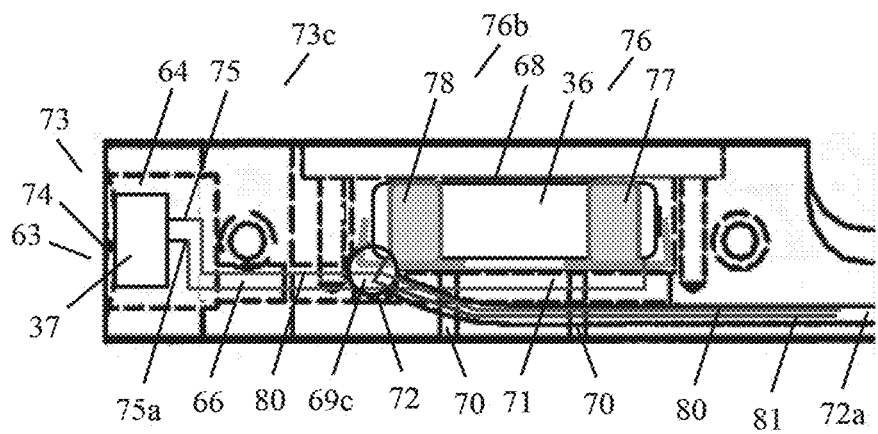
FIG. 13B is an enlarged bottom cross sectional view of the embodiment in FIG. 13.

FIG. 13B is a bottom cross sectional view 43c of the power source section 43 illustrated in FIG. 12, showing an enlarged bottom cross sectional view 73c of the power switch installed 73 within the power switch compartment 64 and an enlarged bottom cross sectional view 76b of the battery installed 76 within the battery compartment 68. The enlarged bottom cross sectional view 73c of the power switch installed 73 shows the power switch 37 comprising a power switch toggle 74, a power switch leg wire 75 and a power switch supply wire 75a.

The power switch 37 is received into the power switch compartment 64 by inserting the power switch leg wire 75 and the power switch supply wire 75a into the power switch compartment 64, thru the power switch wire hole 66 until stopping inside of the battery compartment 68 at the access point 69c. The insertion of the power switch 37 into the power switch compartment 64 continues until the power switch toggle 74 is flush with the back end 63 of the sight rib housing unit 30.

The enlarged bottom cross sectional view 76b of the battery installed 76 shows a battery clip holder (positive) 77 and a battery clip holder (negative) 78, each comprising a clip holder screw hole 79a aligned to a clip holder screw anchor hole 70 and secured to the inside back 68d of the battery compartment 68 with a clip holder screw 79. The power switch leg wire 75 coming out of the power switch wire hole 66 continues to travel thru the power switch wire groove 71 and connects to the battery positive lead wire 80 that is attached to the battery clip holder (positive) 77, while the power switch supply wire 75a coming out of the power switch wire hole 66 becomes the continuation of the battery positive lead wire 80 and travels down thru the wire channel access hole 72 into the wire channel 72a. The battery negative lead wire 81 that is attached to the battery clip holder (negative) 78 also travels down thru the wire channel access hole 72 into the wire channel 72a.

Figure 14:
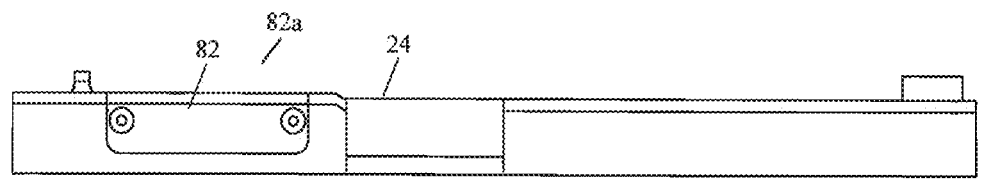
FIG. 14 is a front elevation view of a battery cover fastened to the battery cover frame in FIG. 10A.

FIG. 14 is a right side view of the electronic sighting apparatus 24 showing a front view of a battery cover fastened 82a to the battery compartment frame 69 illustrated in FIG. 10A. The battery cover 82 is designed to hold a 12v battery 36 securely in place within the battery compartment 68 as well as to provide the user easy access to the battery compartment 68 for the purpose of installing or replacing the 12v battery 36 when needed. A more detailed description on the battery cover 82 will follow below.

Figure 15:
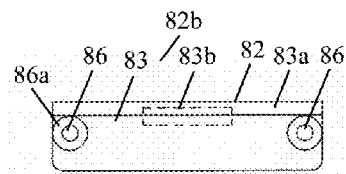
FIG. 15 is an enlarged detailed front elevation view of the battery cover shown in FIG. 14.

FIG. 15 is an enlarged front view 82b of the battery cover 82 illustrated in FIG. 14, showing the front 83 of the battery cover 82 comprising a beveled edge 83a with an adjacent battery cover support 83b designed to strengthen the battery compartment 68. Also shown on the front 83 of the battery cover 82 are two cover screw holes 86 with a counter sink bore 86a designed to provide a means of fastening the battery cover 82 to the battery compartment 68.

Figure 15A:
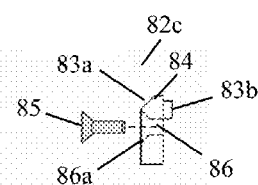
FIG. 15A is an enlarged detailed right side elevation view of the embodiment shown in FIG. 15.
Figure 15C:
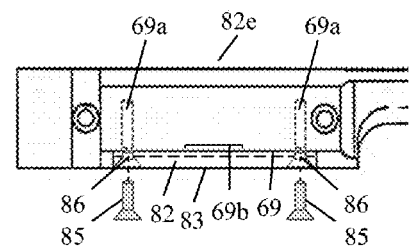
FIG. 15C is a top cross sectional view illustrating a means of fastening the battery cover.
Figure 15B:
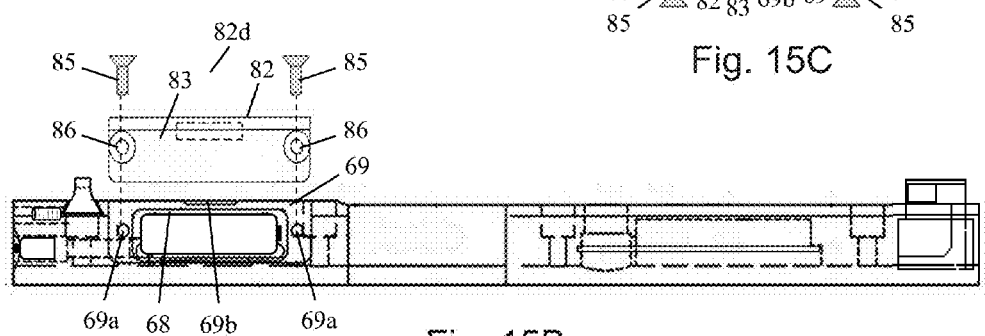
FIG. 15B is a front exploded view illustrating a means of fastening the battery cover.

FIG. 15A, FIG. 15B and FIG. 15C are all illustrations showing different views for a means of fastening the battery cover 82 to the battery compartment 68. FIG. 15A is an enlarged side cross sectional view 82c of the battery cover 82 illustrated in FIG. 15, showing the right side 84 of the battery cover 82 comprising a beveled edge 83a with an adjacent battery cover support 83b. Also shown is a cover screw hole 86 with a counter sink bore 86a designed to receive a battery cover screw 85 for the purpose of fastening the battery cover 82 to the battery compartment 68.

FIG. 15B is a front exploded view 82d illustrating the components utilized as a means of fastening the battery cover 82 to the battery compartment 68. FIG. 15B shows the battery compartment 68 comprising the battery compartment frame 69 with two cover screw anchor holes 69a and a thumbnail slot 69b. The cover screw anchor holes 69a are aligned with the cover screw holes 86 on the front 83 of the battery cover 82; battery cover screws 85 are inserted thru the cover screw holes 86 into the cover screw anchor holes 69a and tightened to hold the battery cover 82 securely in place on the battery compartment 68. The thumbnail slot 69b is designed to be used in the removal process of the battery cover 82; after the battery cover screws 85 are removed from the cover screw anchor holes 69a and the cover screw holes 86, the user inserts their thumbnail into the thumbnail slot 69b to easily separate the battery cover 82 away from the battery compartment frame 69.

FIG. 15C is a top cross sectional view 82e of the components utilized as a means of fastening the battery cover 82 to the battery compartment 68. FIG. 15C shows the placement of the battery cover 82 flush against the battery compartment frame 69 comprising two cover screw anchor holes 69a and a thumbnail slot 69b. The cover screw anchor holes 69a are aligned with the cover screw holes 86 on the front 83 of the battery cover 82; battery cover screws 85 are inserted thru the cover screw holes 86 into the cover screw anchor holes 69a and tightened to hold the battery cover 82 securely in place on the battery compartment frame 69.

Figure 16:
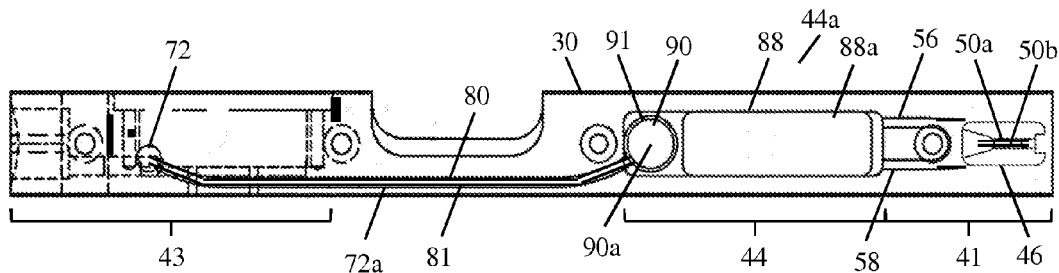
FIG. 16 is a bottom view of the driving circuit section showing the photocell and ECU compartments.

FIG. 16 is a bottom view 44a of the driving circuit section 44 on the sight rib housing unit 30 showing the bottom 88a of the ECU compartment 88 and the bottom 90a of the photocell compartment 90 comprising a photocell compartment rim 91. The ECU compartment 88 is designed to house the ECU 92—FIG. 17 and the photocell compartment 90 is designed to house the photocell 39—FIG. 17.

The ECU 92 is the primary electronic component that connects with the secondary electronic components consisting of a front sight unit 46 in the front sight section 41, a 12v battery power source 36 with a power switch 37 in the power source section 43 and a photocell 39 in the driving circuit section 44. Referring again to FIG. 16, there is shown the front sight section 41 comprised of the front sight unit 46 with a LED positive lead wire 50a and LED negative lead wire 50b, a LED positive wire channel 56 and a LED negative wire channel 58. Also shown is the battery positive lead wire 80 and the battery negative lead wire 81 coming thru the wire channel access hole 72 from inside of the power source section 43 where they are connected to the 12v battery power source 36 and the power switch 37, as illustrated in FIG. 13B; the battery positive lead wire 80 and the battery negative lead wire 81 continue to travel in the wire channel 72a to the driving circuit section 44.

Figure 16A:
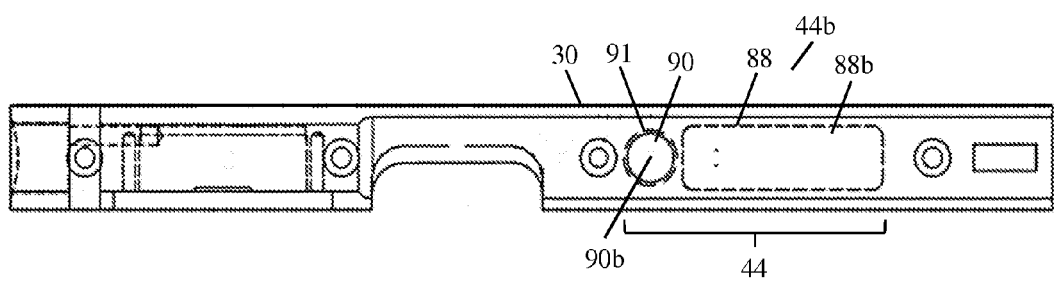
FIG. 16A is an enlarged top cross sectional view of the photocell and ECU compartments.

FIG. 16A is a top cross sectional view 44b of the driving circuit section 44 on the sight rib housing unit 30 showing the top 88b of the ECU compartment 88 and the top 90b of the photocell compartment 90 comprising a photocell compartment rim 91.

Figure 17:
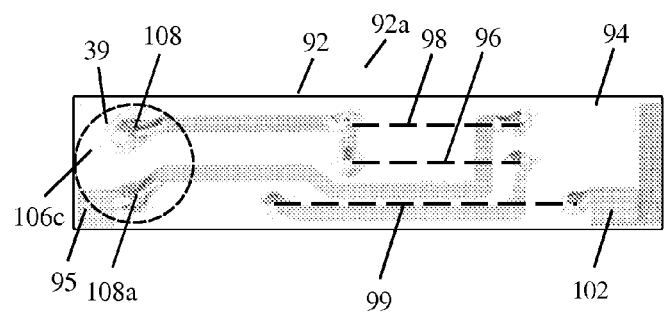
FIG. 17 is an enlarged bottom view of the ECU.

FIG. 17 is an enlarged bottom view 92a of the ECU 92 showing the photocell 39 and the printed circuit board 94. The ECU 92 is shown comprising a printed circuit board 94 with a battery positive solder pad 95, a current limiting resistor R1 (680-ohms) 96, a parallel bypass resistor R2 (270 k-ohms) 98, a reed switch RS 99 and a LED positive solder pad 102. The photocell 39 is shown comprising a photocell top lead wire 108 and a photocell bottom lead wire 108a that are connected to the printed circuit board 94.

Figure 18:
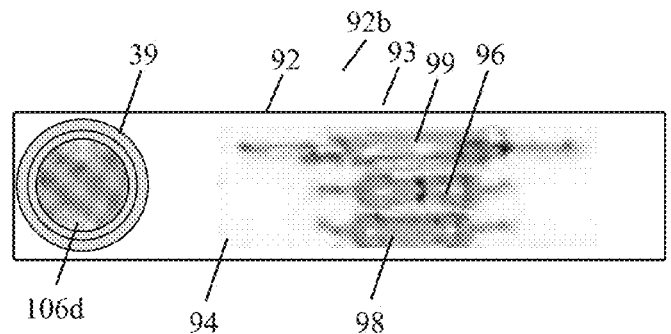
FIG. 18 is an enlarged top view of the ECU.

FIG. 18 is an enlarged top view 92b of the ECU 92 showing the top 106d of the photocell 39 and printed circuit board 94. The ECU 92 comprises a printed circuit board 94 with a current limiting resistor R1 (680-ohms) 96, a parallel bypass resistor R2 (270 k-ohms) 98 and a reed switch RS 99.

Figure 18A:
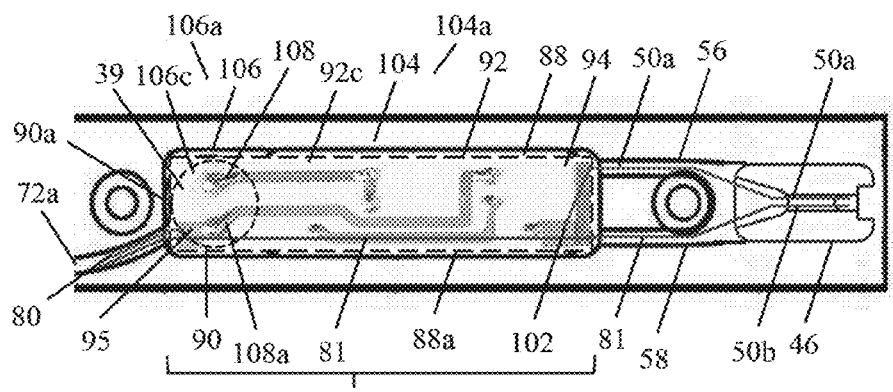
FIG. 18A is an enlarged bottom view of the photocell and ECU installed.

FIG. 18A is an enlarged bottom view 104a of the ECU installed 104 within the ECU compartment 88 and an enlarged bottom view 106a of the photocell installed 106 within the photocell compartment 90. The enlarged bottom view 104a of the ECU installed 104 shows the ECU 92 received into the bottom 88a of the ECU compartment 88 by inserting the ECU 92 into the ECU compartment 88 with the bottom 92c of the ECU 92 facing upward, displaying the printed circuit board 94 with a battery positive solder pad 95 and a LED positive solder pad 102. The battery positive solder pad 95 is connected to the battery positive lead wire 80 coming out of the wire channel 72a from the wire channel access hole 72 shown in FIG. 16. The battery negative lead wire 81 coming out of the wire channel 72a from the wire channel access hole 72, also shown in FIG. 16, travels thru the LED negative wire channel 58 and connects to the LED negative lead wire 50b coming out of the front sight unit 46. The LED positive lead wire 50a coming out of the front sight unit 46 travels thru the LED positive wire channel 56 and connects to the LED positive solder pad 102.

The enlarged bottom view 106a of the photocell installed 106 shows the photocell 39 received into the bottom 90a of the photocell compartment 90 by inserting the photocell 39 into the photocell compartment 90 with the bottom 106c of the photocell 39 facing upward, displaying the photocell top lead wire 108 and the photocell bottom lead wire 108a connecting the photocell 39 to the printed circuit board 94 of the ECU 92. The photocell 39 is inserted into the photocell compartment 90 until it stops flush against the photocell compartment rim 91 shown in FIG. 16.

Figure 19:
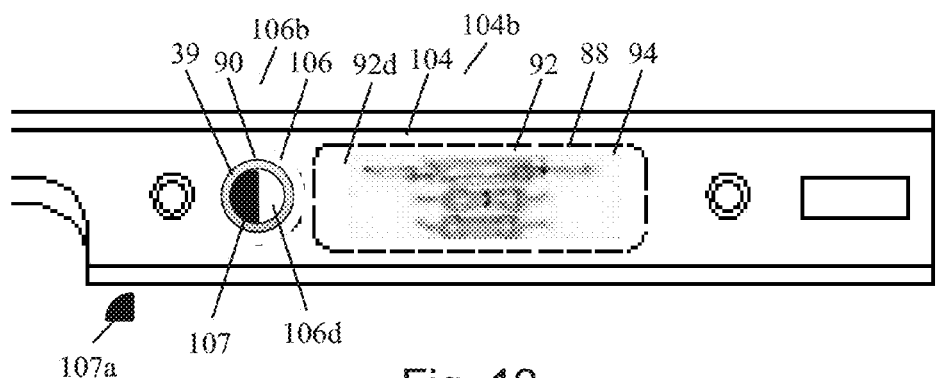
FIG. 19 is an enlarged top view of the photocell and ECU installed.

FIG. 19 is an enlarged top cross sectional view 104b of the ECU installed 104 within the ECU compartment 88 and an enlarged top view 106b of the photocell installed 106 within the photocell compartment 90. The enlarged top cross sectional view 104b of the ECU installed 104 shows the top 92d of the ECU 92 that has been received into the ECU compartment 88 and the enlarged top view 106b of the photocell installed 106 shows the top 106d of the photocell 39 that has been received into the photocell compartment 90. Also shown in FIG. 19, is a photocell ½ shutter 107 and a photocell ¼ shutter 107a that are designed to be placed on the top 106d of the photocell 39 to decrease the amount of ambient light coming into the photocell 39, which in turn causes the LED 35 light output intensity to decrease.

Figure 20:
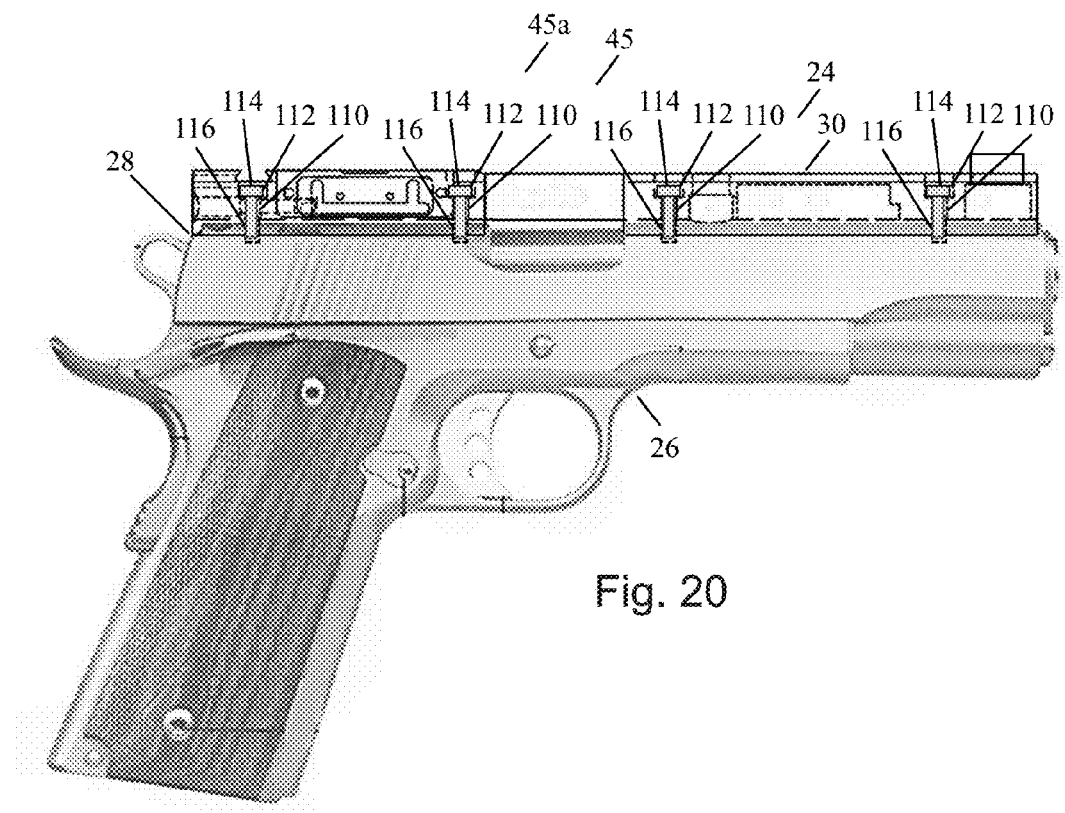
FIG. 20 is a right side cutaway view of the sight rib housing unit showing a means of mounting.
Figure 20A:
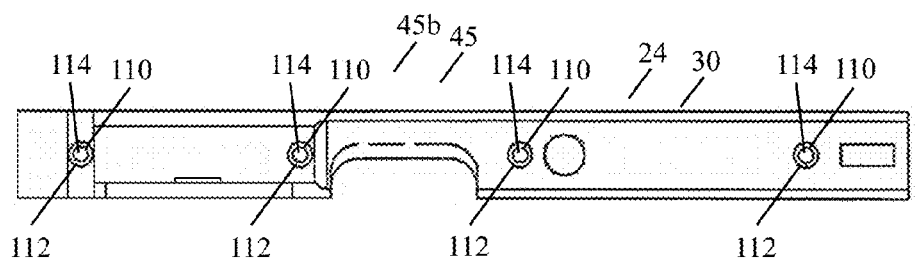
FIG. 20A is a top view of the electronic sighting apparatus showing the top of the anchor bolts.

FIG. 20 and FIG. 20A are both illustrations showing different views of the components utilized as a means of mounting 45 the electronic sighting apparatus 24 to the top of the gun slide 28 on a conventional 45 caliber handgun 26. FIG. 20 is a right side cutaway view 45a of a means of mounting 45 showing the electronic sighting apparatus 24 comprising four bolt holes 110 with a counter bore 112 that are aligned with four ⅜" drill holes 116 on the top of the gun slide 28; ⅜" anchor bolts 114 are inserted thru the bolt holes 110 into the ⅜" drill holes 116 and tightened to hold the electronic sighting apparatus 24 securely in place to the top of the gun slide 28 on the conventional 45 caliber handgun 26. FIG. 20A is a top view 45b of a means of mounting 45 showing the electronic sighting apparatus 24 having received four ⅜" anchor bolts 114 into the bolt holes 110 with a counter bore 112.

Figure 21:
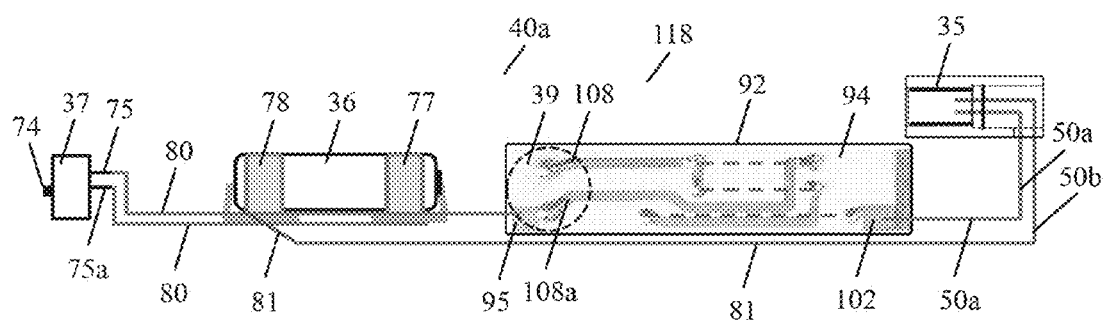
FIG. 21 is an illustration of the primary components utilized by the electronic operation circuit.

Referring to FIG. 21, there is shown an illustration of the primary electronic components 118 utilized by the electronic circuit 40a consisting of a power switch 37, a 12v battery power source 36, a ECU (electronic control unit) 92, a photocell 39 and a LED (light emitting diode) 35. The power switch 37 comprises a power switch leg wire 75 and a power switch supply wire 75a. The 12v battery power source 36 comprises a battery clip holder (positive) 77 with an attached battery positive lead wire 80 and a battery clip holder (negative) 78 with an attached battery negative lead wire 81. The ECU 92 comprises a printed circuit board 94 with a battery positive solder pad 95 and a LED positive solder pad 102. The photocell 39 comprises an attached photocell top lead wire 108 and photocell bottom lead wire 108a connecting the photocell 39 to the printed circuit board 94 of the ECU 92. The LED 35 comprises an attached LED positive lead wire 50a and LED negative lead wire 50b.

The primary electronic components 118 listed above are connected together, starting with the 12v battery power source 36 comprising a battery clip holder (negative) 78 with an attached battery negative lead wire 81 that connects to the LED negative lead wire 50a attached to the LED 35 and the LED positive lead wire 50b attached to the LED 35 connects to the LED positive solder pad 102 on the printed circuit board 94 of the ECU 92. The 12v battery power source 36 also comprises a battery clip holder (positive) 77 with an attached battery positive lead wire 80 that connects to the power switch leg wire 75 attached to the power switch 37 and the power switch supply wire 75a that is attached to the power switch 37 connects to the battery positive lead wire 80 connected to the battery positive solder pad 95 on the printed circuit board 94 of the ECU 92, making a complete circuit for current to flow.

Figure 21A:
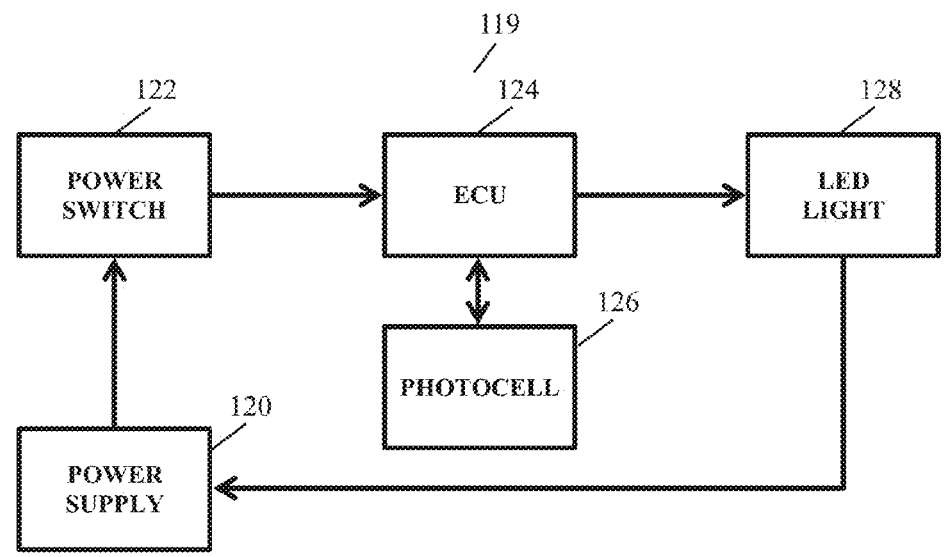
FIG. 21A is a block diagram of the primary components utilized in the electronic operation circuit.

Now referring to FIG. 21A, there is shown a block diagram illustration 119 of the primary components for the electronic operation circuit 40a illustrated in FIG. 21 above. The block diagram illustration 119 is used to understand how the electronic operation circuit 40a works by breaking it down into smaller sections or blocks, showing each block having a specific function and how they are connected together to form a complete circuit so that current can flow. The blocks include:

POWER SUPPLY (block) 120—supplies electrical energy.

POWER SWITCH (block) 122—starts/stops current flow through the circuit.

ECU (block) 124—automatic activation/deactivation of the electronic operation circuit 40a, regulate amount of current to LED 35 to prevent damage to the LED 35, provide minimum current flow to operate the LED 35 in total darkness.

PHOTOCELL (block) 126—regulates the LED 35 light output intensity.

LED LIGHT (block) 128—converts electrical energy to light.

Figure 22:
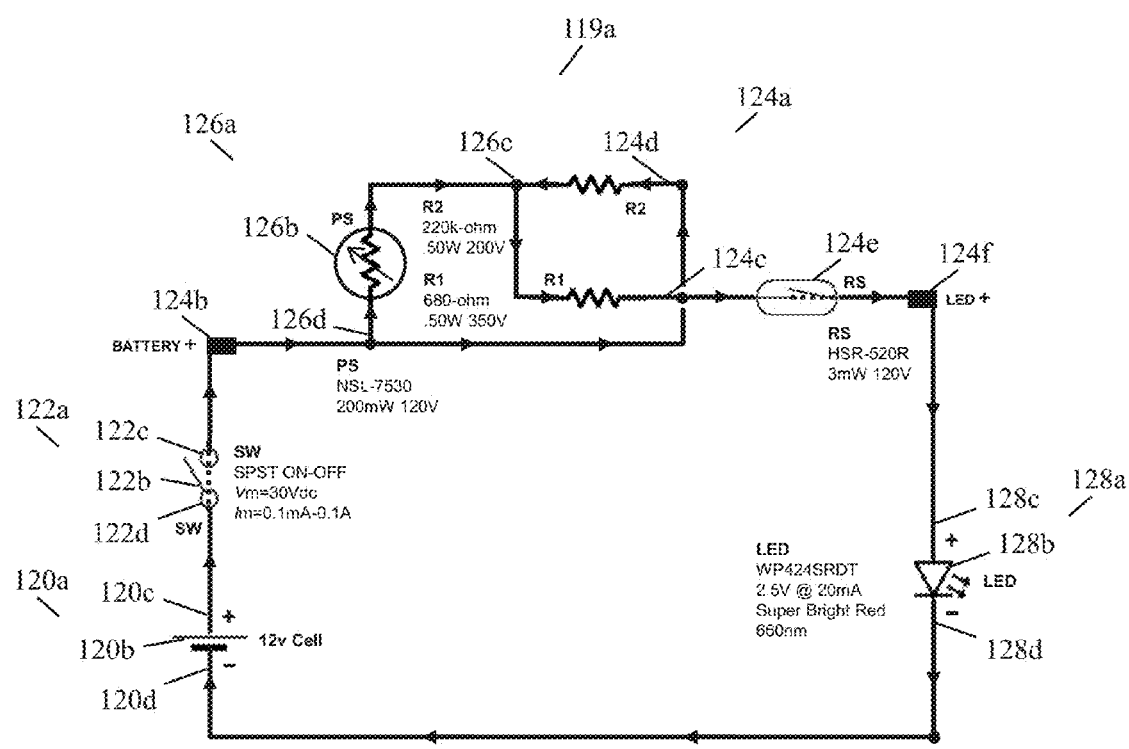
FIG. 22 is an electronic circuit schematic of the embodiment shown in FIG. 21.

FIG. 22 is an illustration of the electronic circuit schematic 119a showing the primary components utilized in the electronic operation circuit 40a shown in FIG. 21. The primary components of the electronic circuit schematic 119a include a power supply circuit schematic 120a, a power switch circuit schematic 122a, an ECU circuit schematic 124a, a photocell circuit schematic 126a and an LED light circuit schematic 128a. The power supply circuit schematic 120a comprises a 12v cell 120b with a cell positive side 120c and a cell negative side 120d. The power switch circuit schematic 122a comprises a SPST (single pole single throw) power switch SW 122b with a ON-OFF pole 122c and a power pole 122d. The ECU circuit schematic 124a comprises a solder pad BATTERY+ 124b, a current limiting resistor R1 (680 ohms) 124c, a parallel bypass resistor R2 (220k ohms) 124d, a reed switch RS 124e and a solder pad LED+ 124f. The photocell circuit schematic 126a comprises a photocell sensor PS 126b with a top connection 126c and a bottom connection 126d. The LED light circuit schematic 128a comprises a light emitting diode LED 128b with an anode+ 128c and a cathode− 128d.

The primary components of the electronic circuit listed above are connected together, starting with the 12v cell 120b comprising a cell positive side 120c that connects to the SPST (single pole single throw) power switch SW 122b at the power pole 122d and the ON-OFF pole 122c of the SPST power switch SW 122b connects to the solder pad BATTERY+ 124b, which connects to one side of the photocell sensor PS 126b and to one side of the parallel bypass resistor R2 124d. The other side of the photocell sensor PS 126b and the parallel bypass resistor R2 124d are both connected to the current limiting resistor R1 124c, which connects to the reed switch RS 124e that is connected to the solder pad LED+ 124f. The solder pad LED+ 124f connects to the anode+ 128c of the light emitting diode LED 128b and the cathode− 128a of the light emitting diode LED 128b connects to the cell negative side 120d of the 12v cell 120b to form a complete circuit for current to flow.

Operation

Referring to FIG. 1, there is shown a handgun automatic electronic sighting system 18 featuring three primary components that include an automatic activation holster 20 containing an electronic sighting apparatus 24 that is mounted on a conventional 45 caliber handgun 26.

The handgun automatic electronic sighting system 18 provides means for fast deployment of the conventional handgun 26 from the automatic activation holster 20 that automatically activates an illuminated front sight 31-FIG. 2A on the electronic sighting apparatus 24, providing the user a means for faster front sight 47-FIG. 7 acquisition and alignment to the target in both day and night conditions.

Referring to FIG. 1A, activation magnet 21 functions to break current flow in electronic operation circuit 40a (FIG. 21) and power off the LED when correctly aligned with electronic sighting apparatus 24 within the automatic activation holster 20.

With reference to FIG. 2A, the electronic sighting apparatus 24 consists of a sight rib housing unit 30 with an electronic operation circuit 40a-FIG. 21. Electronic sighting apparatus features 25a include an illuminating front sight 31, an interchangeable rear sight 33, a 12v battery power source 36, a power switch 37 and a driving circuit 38 with a photocell 39.

Referring to FIG. 7, the front sight section 41 on the sight rib housing unit 30 contains components of the illuminating front sight 31 that include a front sight compartment 51 with a front sight unit installed 54. FIG. 5 is an enlarged right side cross sectional view 49a of the LED light installed 49 in the front sight unit 46; comprising a front sight 47 containing a LED compartment 47a that houses the red LED 35 flush against an aperture 47d.

The illuminating front sight 31 is designed to provide the user a means for faster front sight 47 acquisition and alignment to the target point of aim for a proper sight picture necessary to attain point of impact accuracy of a fired round in both day and night conditions. The illuminating front sight 31 preferably incorporates the use of a red LED 35 as the light source as red light is best suited for supplemental lighting in a night vision environment to reduce the recovery time of the eyes back to night vision. Red light does not negatively affect a viewer's vision as much as do other colors of light.

Referring to FIG. 13, the power source section 43 on the sight rib housing unit 30 contains components of the 12v battery power source 36; including a battery compartment 68 with a battery installed 76 and a power switch compartment 64 with a power switch installed 73. FIG. 13 shows an enlarged front view 76a of the battery installed 76 and an enlarged side cross sectional view 73a of the power switch installed 73.

The enlarged front view 76a shows the battery installed 76 consisting of a battery clip holder (positive) 77 and a battery clip holder (negative) 78, each comprising a clip holder screw hole 79a that is aligned to a clip holder screw anchor hole 70—FIG. 10A and secured to the inside back 68d—FIG. 10A of the battery compartment 68 with a clip holder screw 79.

FIG. 13A is an enlarged front view 73b of the power switch installed 73 in the power switch compartment 64 recessed in the back end 63 of the sight rib housing unit 30, showing the two different operation positions of the power switch toggle 74 on the power switch 37, identified as the toggle position OFF 74a or as the toggle position ON 74b.

FIG. 14 is a right side view of the electronic sighting apparatus 24 showing a front view of a battery cover fastened 82a to the battery compartment frame 69—FIG. 15B of the battery compartment 68. The battery cover 82 is designed to hold the battery installed 76—FIG. 14 securely in place within the battery compartment 68 and to provide the user easy access to the battery compartment 68 for the purpose of initially installing or replacing the battery installed 76 as needed.

FIG. 15B is a front exploded view 82d illustrating the components utilized as a means of fastening the battery cover 82 to the battery compartment 68. FIG. 15B shows the battery compartment 68 comprising the battery compartment frame 69 with two cover screw anchor holes 69a and a thumbnail slot 69b.

Referring to FIG. 18A, the driving circuit section 44 of the sight rib housing unit 30 contains components of the driving circuit 38, including an ECU compartment 88 with a ECU installed 104 and a photocell compartment 90 with a photocell installed 106. FIG. 18A is an enlarged bottom view 104a of the ECU installed 104 within the ECU compartment 88 and an enlarged bottom view 106a of the photocell installed 106 within the photocell compartment 90. The enlarged bottom view 104a of the ECU installed 104 shows the bottom 92c of the ECU 92 facing outward from the ECU compartment 88, displaying the printed circuit board 94 with a battery positive solder pad 95 and a LED positive solder pad 102.

FIG. 18 is an enlarged top view 92b of the ECU 92, showing the ECU electronic components 93 comprising a printed circuit board 94 with a current limiting resistor R1 (680-ohms) 96, a parallel bypass resistor R2 (270 k-ohms) 98, and a reed switch RS 99. The printed circuit board 94 (top 92d—FIG. 19)—mechanically supports and electrically connects the ECU electronic components 93. The current Limiting Resistor R1 (680-ohms) 96—restricts the flow of current to limit the current passing through the LED 35. The parallel Bypass Resistor R2 (220 k-ohms) 98—provide minimum current flow to operate the LED 35 in total darkness. Reed Switch RS 99—operated by an applied magnetic field for automatic activation/deactivation of the electronic operation circuit 40a. The contacts are normally closed and opened by bringing a magnet close to the switch. Once the magnet is pulled away, the reed switch RS 99 returns to closed position.

Referring to FIG. 18A, the enlarged bottom view 106a of the photocell installed 106 shows the photocell 39 received into the bottom 90a of the photocell compartment 90 with the bottom 106c of the photocell 39 facing upward, displaying the photocell top lead wire 108 and the photocell bottom lead wire 108a connecting the photocell 39 to the printed circuit board 94 of the ECU 92. The electronic sighting apparatus 24 incorporates the use of the photocell 39 to provide a way for automatically adjusting the intensity of light output from the LED 35 in correlation to the amount of ambient light available. The photocell 39 functions as a variable resistor in the electronic operation circuit 40a—FIG. 21. When the amount of ambient light received by the photocell 39 increases, the photocell 39 responds by reducing the level of resistance, which in turn, increases the level of current flow in the electronic operation circuit 40a, causing the LED 35 light output intensity to increase. When the amount of ambient light received by the photocell 39 decreases, the photocell 39 responds by increasing the level of resistance, which in turn, reduces the level of current flow in the electronic operation circuit 40a, causing the LED 35 light output intensity to decrease. When there is no ambient light available (total darkness), the electronic sighting apparatus 24 is designed to produce a minimum amount of light output from the LED 35.

FIG. 19 is an enlarged top view 106b of the photocell installed 106 showing the top 106d of the photocell 39 that has been received into the photocell compartment 90. Also shown in FIG. 19, is a photocell ½ shutter 107 and a photocell ¼ shutter 107a that are designed with an adhesive side to be placed on the top 106d of the photocell 39 to decrease the amount of ambient light coming into the photocell 39, which in turn causes the LED 35 light output intensity to decrease.

FIG. 20 and FIG. 20A are both illustrations showing different views of the components utilized as a means of mounting 45 the electronic sighting apparatus 24 to the top of the gun slide 28 on a conventional 45 caliber handgun 26. FIG. 20 is a right side cutaway view 45a of a means of mounting 45 showing the electronic sighting apparatus 24 comprising four bolt holes 110 with a counter bore 112 that are aligned with four ⅜" drill holes 116 on the top of the gun slide 28; ⅜" anchor bolts 114 are inserted thru the bolt holes 110 into the ⅜" drill holes 116 and tightened to hold the electronic sighting apparatus 24 securely in place to the top of the gun slide 28 on the conventional 45 caliber handgun 26. FIG. 20A is a top view 45b of a means of mounting 45 showing the electronic sighting apparatus 24 having received four ⅜" anchor bolts 114 into the bolt holes 110 with a counter bore 112.

Once both the SPST power switch SW 122b and reed switch RS 124e are activated, current is allowed to flow through the completed circuit. Following conventional current flow; starting at the 12v cell 120b: Current flows from the cell positive side 120c through the SPST power switch SW 122b and through the solder pad BATTERY+ 124b to one side (bottom connection 126d) of the photocell sensor PS 126b and to one side of the parallel bypass resistor R2 124d. With ambient light available, current flow continues through both, the photocell sensor PS 126b and parallel bypass resistor R2 124d, then through a common parallel point (top connection 126c) to one side of the current limiting resistor R1 124c. Without ambient light available, current flow continues only through the parallel bypass resistor R2 124d, then through the common parallel point (top connection 126c) to one side of the current limiting resistor R1 124c. The current then flows through the current limiting resistor R1 124c through the reed switch RS 124e and through the solder pad LED+ 124f. Current flow continues through the anode+ 128c and the cathode− 128d of the light emitting diode LED 128b to the cell negative side 120d of the 12v cell 120b, which completes the circuit.

The photocell sensor PS 126b functions as a variable resistor automatically adjusting the intensity of light output from the light emitting diode LED 128b in correlation to the amount of ambient light available. Increased ambient light decreases resistance the photocell sensor PS 126b imposes, causing more current flow through the light emitting diode LED 128b, increasing the brightness. Decreased ambient light increases resistance, causing less current to flow, decreasing the brightness.

When there is no ambient light available, as in total darkness, the photocell sensor PS 126b resistance reaches 6.7 megohms and shuts off all current flow through the photocell sensor PS 126b to the light emitting diode LED 128b. This causes the current to flow through the parallel bypass resistor R2 124d to a common parallel point (top connection 126c) to one side of the current limiting resistor R1 124c. The purpose of the parallel bypass resistor R2 124d is to maintain a minimum amount of current flow to the light emitting diode LED 128b when the photocell sensor PS 126b shuts down. The purpose of the current limiting resistor R1 124c is to protect the light emitting diode LED 128b from overcurrent.

Figure 23:
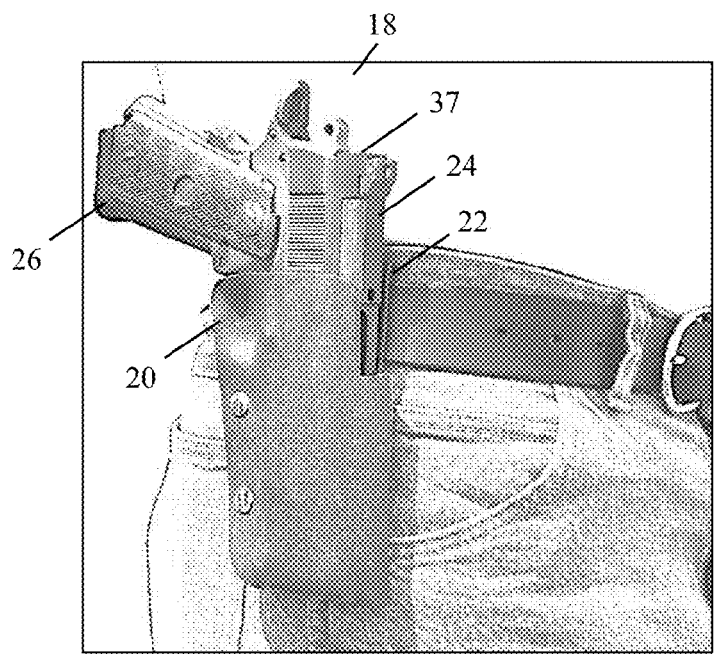
FIG. 23 illustrates the handgun automatic electronic sighting system attached to a belt.
Figure 24:
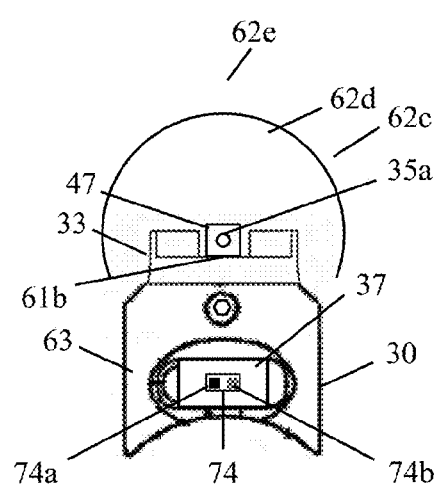
FIG. 24 is a sight picture showing sight alignment in relation to a target.

The handgun automatic electronic sighting system 18 provides a method for faster front sight 47—FIG. 24 acquisition and sight alignment to the target in both day and night conditions. The handgun automatic electronic sighting system 18 can be used as a non-electronic device for standard sight shooting by leaving the power switch 37 off. Using FIG. 23 and FIG. 24 as a reference, the operation steps to use the Handgun Automatic Electronic Sighting System 18 are as follows:

1. Attach the automatic activation holster 20 to your belt, using the provided belt mount 22.
2. Slide the power switch toggle 74 to toggle position ON 74b.
3. Grip the handgun 26; pull straight up until clear of the automatic activation holster 20. NOTE: Once the electronic sighting apparatus 24 is drawn from the automatic activation holster 20, a luminous red dot 35a in the front sight 47 is activated.
4. Raise the electronic sighting apparatus 24 to your line of sight (eye level) with the target 62d.
5. Acquire the luminous red dot 35a in the front sight 47 and align to the target 62d.
6. Squeeze the trigger.
7. When the electronic sighting apparatus 24 is returned to the automatic activation holster 20 the luminous red dot 35a is deactivated.

Although the description above contains many specific descriptions, materials, and dimensions, these should not be construed as limiting the scope of the invention but as merely providing illustrations of some of the presently preferred embodiments of this invention. Thus the scope of the invention should be determined by the appended claims and their legal equivalents, rather than by the examples given.

What is claimed is:

1. A weapon sighting system comprising:
   a handheld weapon;
   a sight rib housing secured to said weapon;
   said sight rib housing including an electronic circuit having a power supply, a photocell, a reed switch, and a front sight;
   a light emitting diode (LED) in said front sight,
   whereby light intensity of said LED is controlled by said electronic circuit in relation to the ambient light measured by said photocell
   wherein said sight rib housing includes an electronic control unit compartment including said reed switch;
   a current limiting resistor;
   a parallel bypass resistor; and
   wherein said reed switch, said current limiting resistor, and said parallel bypass resistor are embedded in silicone rubber.

2. The weapon sighting system of claim 1 including a holster.

3. The weapon sighting system of claim 2 wherein said holster is constructed of non-magnetic material.

4. The weapon sighting system assembly of claim 3 including a magnet in said holster.

5. The weapon sighting system of claim 4 wherein said wherein said sight rib housing is constructed of non-magnetic material.

6. The weapon sighting system of claim 5 wherein placement of said handheld weapon in said holster places said reed switch of said handheld weapon in close proximity with said magnet of said holster.

7. The weapon sighting system assembly of claim 1 including
a dove tail groove extending laterally across said sight rib housing; and
a rear sight in said dove tail groove.

8. A weapon sighting system for attachment to a weapon, said weapon sighting system comprising:
a sight rib housing;
said sight rib housing including an electronic circuit having a power supply, a photocell, a reed switch, and a front sight including a light emitting diode (LED);
a fastening arrangement for securing said sight rib housing to the weapon, whereby the light intensity of said LED is controlled by said electronic circuit in relation to the ambient light measured by said photocell;
wherein said sight rib housing includes an electronic control unit compartment including said reed switch;
a current limiting resistor;
a parallel bypass resistor; and
wherein said reed switch, said current limiting resistor, and said parallel bypass resistor are embedded in silicone rubber.

9. The weapon sighting system of claim 8 including an activating holster for activating said electronic circuit.

10. The weapon sighting system of claim 9 wherein said activating holster is constructed of non-magnetic material.

11. The weapon sighting system of claim 8 wherein said sight rib housing is constructed of non-magnetic material.

12. A method of activating the sighting system of a weapon upon withdrawal from a holster, said method comprising:
a) providing a non-magnetic sight rib housing for attachment to the weapon, said sight rib housing including an electronic circuit having a power supply, a photocell, a reed switch, and a front sight including a light emitting diode (LED);
b) securing a magnet in said holster in such a way that said magnet is in close proximity to said reed switch when said weapon is placed in said holster;
c) providing said reed switch with a held open state, whereby withdrawal of the weapon from the holster switches the reed switch to the normally closed state thereby activating the LED and the electronic circuit;
d) providing said reed switch with a normally closed state, whereby return of the weapon to the holster brings the reed switch of the weapon in close proximity to the magnet in said holster and switches the reed switch to its held open state, thereby deactivating the LED and the electronic circuit;
e) providing said electronic circuit with a current limiting resistor to limit the current passing through said LED and a parallel bypass resistor to provide a minimum current flow to operate said LED in total darkness; and
f) embedding said reed switch, said current limiting resistor, and said parallel bypass resistor in silicone rubber.

13. The method of claim 12 wherein said holster is non-magnetic.

14. The method of claim 12 wherein said LED is a red LED.

15. The method of claim 12 that includes mounting said reed switch, said current limiting resistor, and said parallel bypass resistor on a circuit board.

16. The method of claim 12 that includes controlling the light intensity of said LED in relation to the ambient light measured by said photocell.

* * * * *